US012628697B2

(12) United States Patent
Wu et al.

(10) Patent No.: US 12,628,697 B2
(45) Date of Patent: May 12, 2026

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Chih-Wei Wu, Yilan County (TW); Ying-Ching Shih, Hsinchu City (TW); Wen-Chih Chiou, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 558 days.

(21) Appl. No.: 18/152,761

(22) Filed: Jan. 11, 2023

(65) Prior Publication Data

US 2024/0105701 A1     Mar. 28, 2024

Related U.S. Application Data

(60) Provisional application No. 63/409,218, filed on Sep. 23, 2022.

(51) Int. Cl.
| | |
|---|---|
| *H01L 21/56* | (2006.01) |
| *H01L 23/00* | (2006.01) |
| *H01L 23/31* | (2006.01) |
| *H01L 23/498* | (2006.01) |
| *H01L 25/18* | (2023.01) |

(52) U.S. Cl.
CPC ............ *H01L 25/18* (2013.01); *H01L 21/561* (2013.01); *H01L 23/3128* (2013.01); *H01L 23/49822* (2013.01); *H01L 24/97* (2013.01); *H01L 2224/97* (2013.01)

(58) Field of Classification Search
None
See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |

(Continued)

FOREIGN PATENT DOCUMENTS

| | | |
|---|---|---|
| TW | 200515568 | 5/2005 |
| TW | 200737437 | 10/2007 |
| TW | 202017131 | 5/2020 |

OTHER PUBLICATIONS

"Office Action of Taiwan Counterpart Application", issued on Jan. 3, 2024, p. 1-p. 6.

*Primary Examiner* — Jay C Chang
(74) *Attorney, Agent, or Firm* — JCIPRNET

(57) ABSTRACT

A package structure and methods for forming the package structure are provided. The package structure includes a package component, an encapsulant disposed around the package component, and a redistribution structure disposed over the package component and the encapsulant. The package component includes a substrate, a protection structure, which includes an organic material, over a first surface of the substrate, and a multi-layered structure encapsulated by the protection structure. Sidewalls of the multi-layered structure are spaced apart from the encapsulant by the protection structure.

20 Claims, 21 Drawing Sheets

(56) References Cited

U.S. PATENT DOCUMENTS

| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2016/0148904 | A1* | 5/2016 | Zhai | H01L 21/4853 |
| | | | | 438/109 |
| 2019/0355637 | A1* | 11/2019 | Chen | H01L 21/56 |
| 2021/0028146 | A1* | 1/2021 | Lee | H01L 25/105 |

* cited by examiner

PACKAGE STRUCTURE AND MANUFACTURING METHOD THEREOF

CROSS-REFERENCE TO RELATED APPLICATION

This application claims the priority benefit of U.S. provisional application Ser. No. 63/409,218, filed on Sep. 23, 2022. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages.

Currently, a technique of integrated fan-out (InFO) packages having more compactness is developed and utilized in various package applications. However, the manufacturing of the semiconductor device in a miniaturized scale becomes more complicated. An increase in a complexity of manufacturing the semiconductor device may cause deficiencies such as delamination of components, or other issues, resulting in a high yield loss of the semiconductor device. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
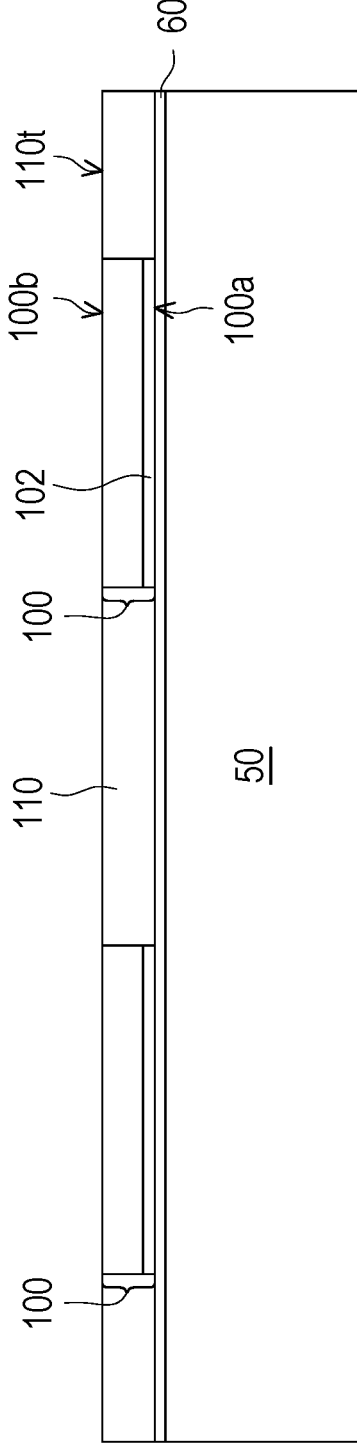
FIG. 1 through FIG. 10 are schematic cross-sectional views of various stages in a manufacturing method of a package structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 through FIG. 10 are schematic cross-sectional views of various stages in a manufacturing method of a package structure 10A in accordance with some embodiments of the disclosure. It is understood that additional operations can be provided before, during, and after processes shown by FIG. 1 through FIG. 10, and some of the operations described below can be replaced or eliminated, for additional embodiments of the method. The order of the operations/processes may be interchangeable.

Referring to FIG. 1, a carrier 50 including a bonding layer 60 formed on a surface thereof is provided. The carrier 50 may be a semiconductor wafer, and the bonding layer 60 may be a bonding layer prepared for fusion bond. In some embodiments, the bonding layer 60 is a deposited layer formed over the top surface of the carrier 50. In some alternative embodiments, the bonding layer 60 is a portion of the carrier 50 for fusion bond. For example, the material of the carrier 50 includes silicon or other suitable semiconductor materials, and the material of the bonding layer 60 includes silicon (Si), silicon dioxide ($SiO_2$), or other suitable bonding materials. In some other embodiments, the bonding layer 60 is a native oxide layer naturally grown on the surface of the carrier 50.

A plurality of device dies 100 is then provided and placed on the top surface of the bonding layer 60. In some embodiments, the device dies 100 include logic dies, which may be central processing unit (CPU) dies, micro control unit (MCU) dies, input-output (I/O) dies, baseband (BB) dies, or application processor (AP) dies. In alternative embodiments, the device dies 100 include memory dies, such as dynamic random access memory (DRAM) dies, static random access memory (SRAM) dies, high-bandwidth memory (HBM) dies, hybrid memory cubes (HMC) dies. Further, in some embodiments, each device die 100 includes a semiconductor substrate, through vias (not shown) that penetrate through the semiconductor substrate for electrical connection, and a bonding portion 102 at an active surface 100a (e.g., a front surface) of the device die 100. In some embodiments, a material of the bonding portion 102 includes silicon, silicon dioxide or other suitable bonding materials.

The device dies 100 are placed on the bonding layer 60 in a way that the active surfaces 100*a* of the device dies 100 face the top surface of the bonding layer 60 such that the bonding portions 102 are in physical contact with the bonding layer 60. Further, as shown in FIG. 1, the device dies 100 may be placed onto the bonding layer 60 in a side-by-side manner such that the device dies 100 are spaced apart from each other. After the device dies 100 are picked up and placed on the bonding layer 60, a die-to-wafer fusion bonding process is performed to bond the device dies 100 to the carrier 50, so that a fusion bonding interface is formed between the bonding portions 102 and the bonding layer 60. For example, the fusion bonding process for bonding the bonding layer 60 and the bonding portions 102 of the device dies 100 is performed at a temperature ranging from about 25° C. to about 100° C., and the bonding layer 60 is directly bonded to the bonding portions 102 of the device dies 100 after the fusion bonding process is performed. In other words, there is no intermediate layer formed between the bonding layer 60 and the bonding portions 102. In some embodiments, the aforementioned fusion bonding interface is or include a Si—Si fusion bonding interface, a Si—SiO$_2$ fusion bonding interface, a SiO$_2$—SiO$_2$ fusion bonding interface, or other suitable fusion bonding interfaces.

Subsequent to the fusion bonding of the device dies 100 and the bonding layer 60, a gap-filling material is formed in the gaps between adjacent device dies 100. The gap-filling material may cover the bonding layer 60 and the device dies 100. In some embodiments, the gap-filling material is formed by an over-molding process such that the device dies 100 are encapsulated by the gap-filling material. In some embodiments, the gap-filling material includes insulation material or dielectric material. For example, the gap-filling material is an oxide such as silicon oxide. Thereafter, a grinding process is performed from a top surface (not shown) of the gap-filling material to expose the device dies 100 and to further thin down the thickness of the device dies 100 to a desired thickness, in accordance with some embodiments. In some embodiments, the grinding process includes a mechanical grinding process, a chemical mechanical polishing (CMP) process, or a combination thereof. The resulting structure is shown in FIG. 1.

As shown in FIG. 1, the remaining gap-filling material locates between the device dies 100 and may be referred to as an insulation layer 110. In some embodiments, after the grinding process, a top surface 110*t* of the insulation layer 110 and back surfaces 100*b* of the device dies 100, which is opposite to the active surfaces 100*a*, are substantially levelled and coplanar with each another. In other words, the insulation layer 110 laterally surrounds each device die 100 such that sidewalls of the device dies 100 are covered by the insulation layer 110.

Figure 2:
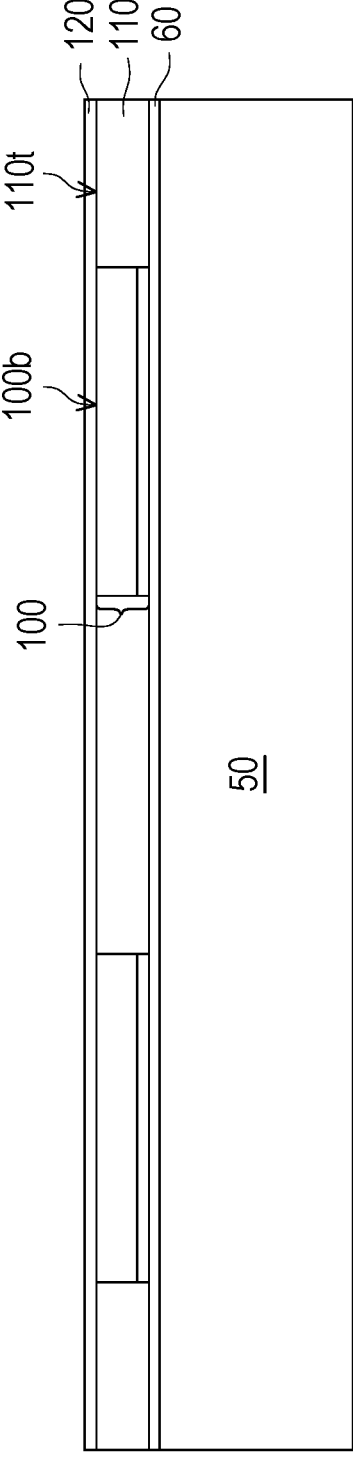

Referring to FIG. 2, a bonding layer 120 is globally formed over the device dies 100 and the insulation layer 110. For example, the bonding layer 120 is formed covering the back surfaces 100*b* of the device dies 100 and the top surface 110*t* of the insulation layer 110. In some embodiments, the bonding layer 120 is formed through a chemical vapor deposition (CVD) process or other suitable deposition process. In some embodiments, the bonding layer 120 is a bonding layer prepared for fusion bond, and the material of the bonding layer 120 includes silicon, silicon dioxide, or other suitable bonding materials.

Figure 3:
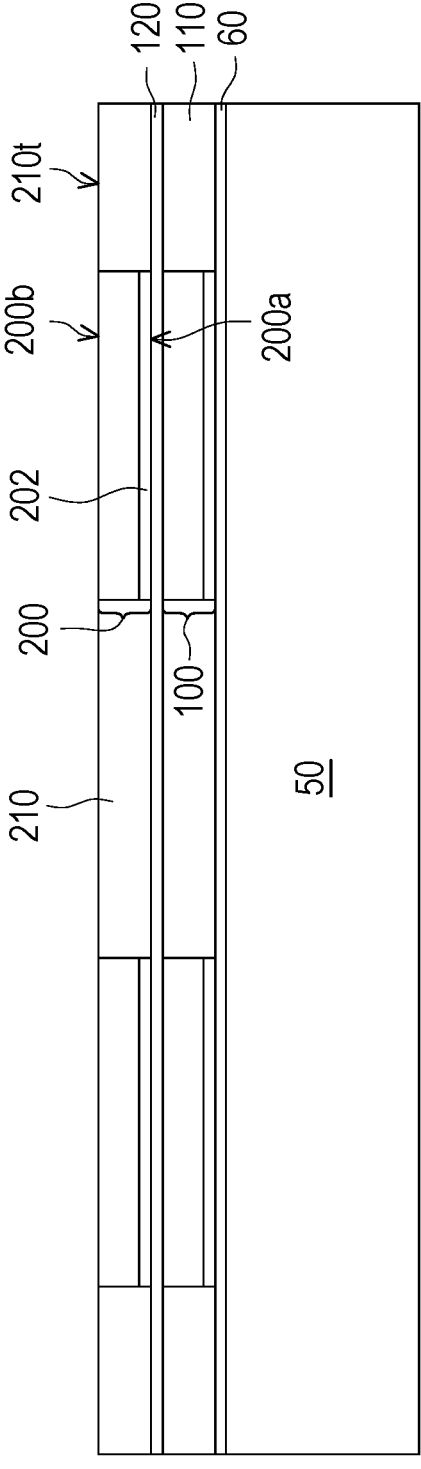

Referring to FIG. 3, a plurality of device dies 200 is provided and placed on the top surface of the bonding layer 120. The device dies 200 may include logic dies or memory dies and may include the same or different types of dies than the device dies 100. In a certain embodiment, the device dies 200 include memory dies such as SRAM dies, and the device dies 100 include logic dies such as CPU dies. In some embodiments, each of the device dies 200 also includes an active surface 200*a* (i.e., a front surface), and a bonding portion 202 is formed at the active surface 200*a*. The bonding portion 202 may include similar material as the bonding portion 102.

As shown in FIG. 3, the device dies 200 are placed face-down on the top surface of the bonding layer 120 such that the active surfaces 200*a* of the device dies 200 face the top surface of the bonding layer 120, and the bonding portions 202 are in physical contact with the bonding layer 120. In addition, the device dies 200 are disposed side-by-side on the bonding layer 120 such that the device dies 200 are spaced apart from each other. In the illustrated embodiments, the device dies 200 have substantially the same sizes as the device dies 100, and the device dies 200 are disposed in vertically alignment with the underlying device dies 100. That is, sidewalls of the device dies 200 are substantially aligned with sidewalls of the device dies 100. It is understood that the dimensional relationship and the position configuration shown in FIG. 3 are merely examples and can be changed based on the design requirements. For example, the sizes of the device dies 200 can be smaller or larger than the device dies 100.

After the device dies 200 are picked up and placed on the bonding layer 120, a fusion bonding process is performed to bond the device dies 200 to the underlying structure, and a fusion bonding interface is formed between the bonding portions 202 of the device dies 200 and the bonding layer 120. The fusion bonding interface may include a Si—Si fusion bonding interface, a Si—SiO$_2$ fusion bonding interface, a SiO$_2$—SiO$_2$ fusion bonding interface, or other suitable fusion bonding interfaces.

Subsequent to the fusion bonding of the device dies 200 and the bonding layer 120, an insulation layer 210 is formed between the device dies 200 and over the bonding layer 120. In some embodiments, the insulation layer 210 is formed through depositing a gap-filling material (e.g., insulation material such as silicon oxide) covering the bonding layer 120 and the device dies 200, followed by performing a grinding process, such as CMP process or mechanical grinding process, to expose the device dies 200. In some embodiments, thicknesses of the device dies 200 are reduced during the grinding process. As shown in FIG. 3, a top surface 210*t* of the insulation layer 210 and back surfaces 200*b* of the device dies 200, which is opposite to the active surfaces 200*a*, are substantially levelled and coplanar with each other after the grinding process. In other words, the insulation layer 210 laterally surrounds each device die 200 such that sidewalls of the device dies 200 are covered by the insulation layer 210.

Figure 4:
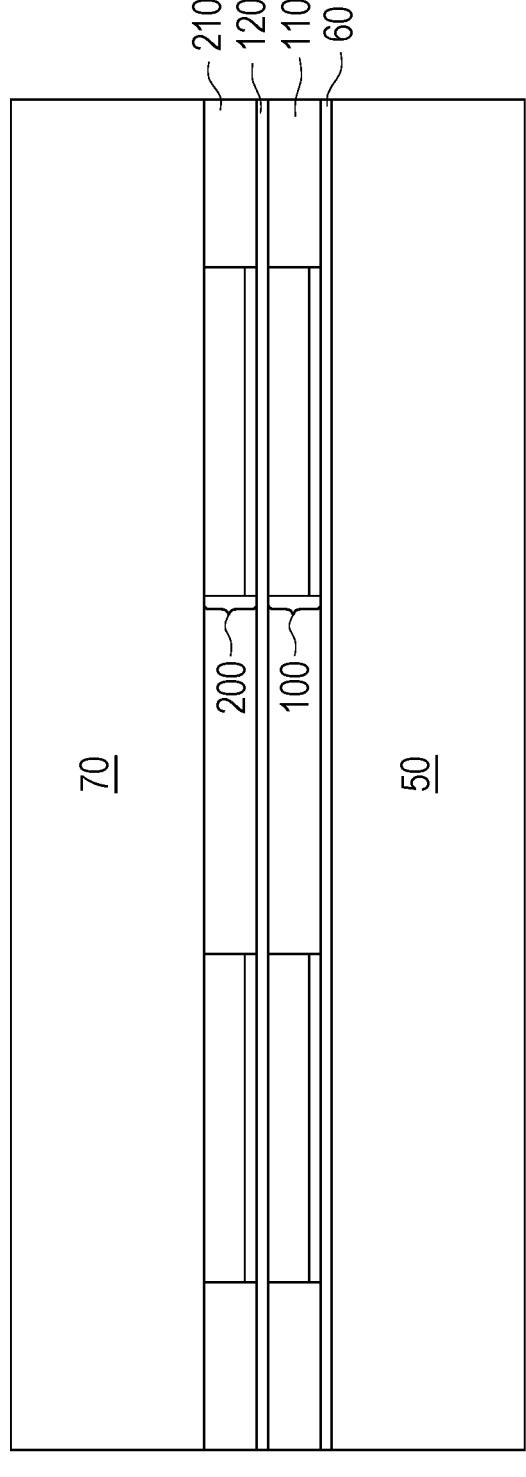

Referring to FIG. 4, a support substrate 70 is provided and disposed over the structure shown in FIG. 3. In some embodiments, the support substrate 70 is a semiconductor wafer such as a silicon wafer. In some embodiments, the support substrate 70 is bonded to the device dies 200 and the insulation layer 210 through a wafer-to-wafer fusion bonding process. For example, the support substrate 70 may be a semiconductor wafer (e.g., silicon wafer) having a bonding layer (not shown) formed thereon, such that a fusion bonding interface (e.g., a Si—SiO$_2$ fusion bonding interface, a SiO$_2$—SiO$_2$ fusion bonding interface, or a combination thereof) is formed between the support substrate 70 and the device dies 200 and between the support substrate 70 and the insulation layer 210. Alternatively, the support substrate 70 may be directly bonded to the device dies 200 and the insulation layer 210.

Figure 5:
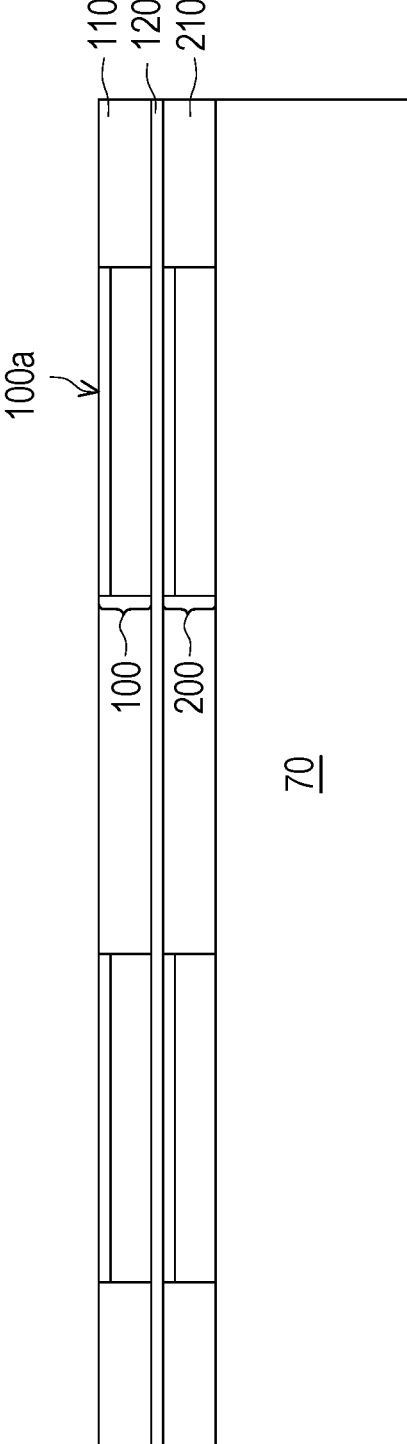

Referring to FIG. 4 and FIG. 5, subsequent to the wafer-to-wafer bonding process, a de-bonding or a removal process may be performed to remove the bonding layer 60 and the carrier 50. The de-bonding process may be a laser lift-off process or other suitable removal processes. After removal of the bonding layer 60 and the carrier 50, the active surfaces 100a of the device dies 100 and a surface of the insulation layer 110 are revealed. The structure de-bonded from the bonding layer 60 and the carrier 50 is then flipped upside down, and the active surfaces 100a of the device dies 100 and the exposed surface of the insulation layer 110 are faced up.

Figure 6:
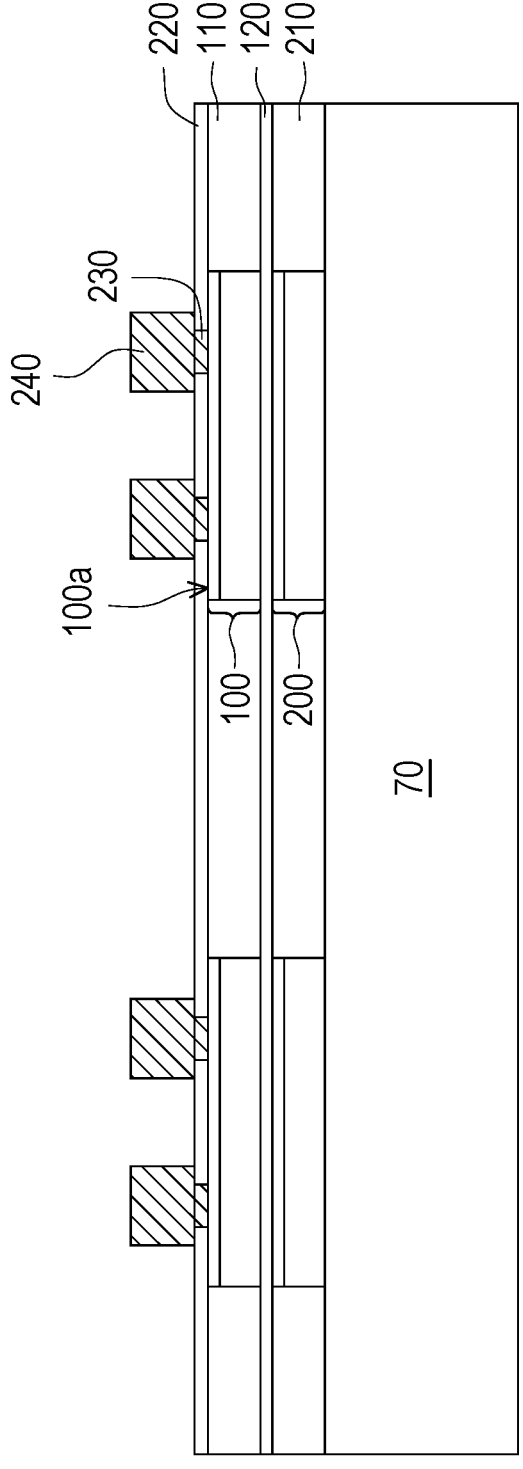

Referring to FIG. 6, a passivation layer 220 and a plurality of conductive pads 230 are formed over the structure shown in FIG. 5, and a plurality of conductive pillars 240 are formed over the conductive pads 230 and over a portion of the passivation layer 220. In some embodiments, the conductive pads 230 are formed over the active surfaces 100a of the device dies 100, and the conductive pads 230 may be electrically connected to active devices (not shown) in each device die 100 through various conductive features (not shown). The conductive pads 230 may include a conductive material such as aluminum, copper, or the like. The passivation layer 220 is then formed over the device dies 100 and the insulation layer 110. Although not explicitly illustrated in FIG. 6, it is understood that one or more passivation layers 220 may be formed over the device dies 100 and the insulation layer 110, and the passivation layer 220 may partially cover the conductive pads 230. In some embodiments, a material of the passivation layer 220 includes silicon oxide, silicon oxynitride, silicon nitride, benzocyclobutene (BCB), polybenzoxazole (PBO), polyimide, or a combination thereof.

Thereafter, the conductive pillars 240 are formed in physical and electrical contact with the conductive pads 230. In some embodiments, the conductive pillars 240 are formed by first forming and patterning a photoresist (not shown) to form openings in the photoresist that corresponds to the conductive pillars 240 to be formed, followed by a plating process, such as electroplating or electroless plating. In some embodiments, the conductive pillars 240 include conductive metal such as copper, titanium, gold, aluminum, tungsten, cobalt, palladium, nickel, silver, compounds or alloys of the same, or other conductive materials. The photoresist may then be removed by ashing or stripping process.

Figure 7:
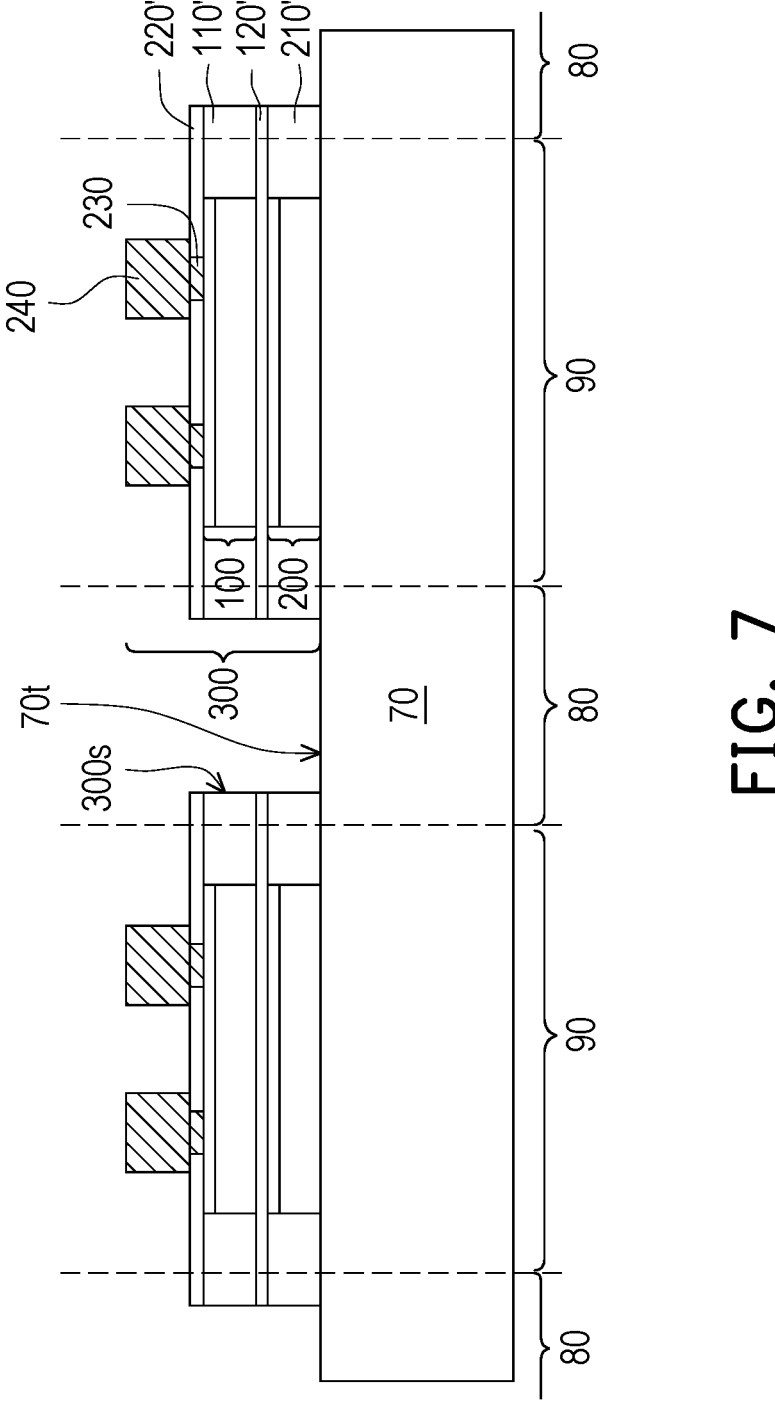

Referring to FIG. 7, a pre-singulation (or pre-cutting) process is performed. For example, the pre-singulation process is performed at scribe line regions 80 to cut through the passivation layer 220, the bonding layer 120, and the insulation layers 110, 210. In some embodiments, a region between two neighboring scribe line regions 80 is referred to as a package region 90. Further, the pre-singulation process may stop at a top surface 70t (i.e., a front surface) of the support substrate 70, such that the support substrate 70 may remain intact during the pre-singulation process. In some embodiments, the pre-singulation process is a dicing process, which may include mechanical blade sawing or laser cutting.

As shown in FIG. 7, die stack structures 300 are respectively formed at the package regions 90 and separated from each other after the pre-singulation process. Each of the die stack structures 300 includes a device die 200 surrounded by a singulated insulation layer 210', a singulated bonding layer 120' over the device die 200 and the singulated insulation layer 210', a device die 100 over the singulated bonding layer 120' and surrounded by a singulated insulation layer 110', and a singulated passivation layer 220' over the device die 100 and the singulated insulation layer 110'. In addition, sidewalls of the singulated passivation layer 220', the singulated bonding layer 120' and the singulated insulation layers 110', 210' may together form continuous sidewalls 300s of the die stack structure 300 over the support substrate 70, which are substantially straight and vertical. In some embodiments, the sidewalls 300s stand on the support substrate 70 at the scribe region 80 due to process variations.

Figure 8:
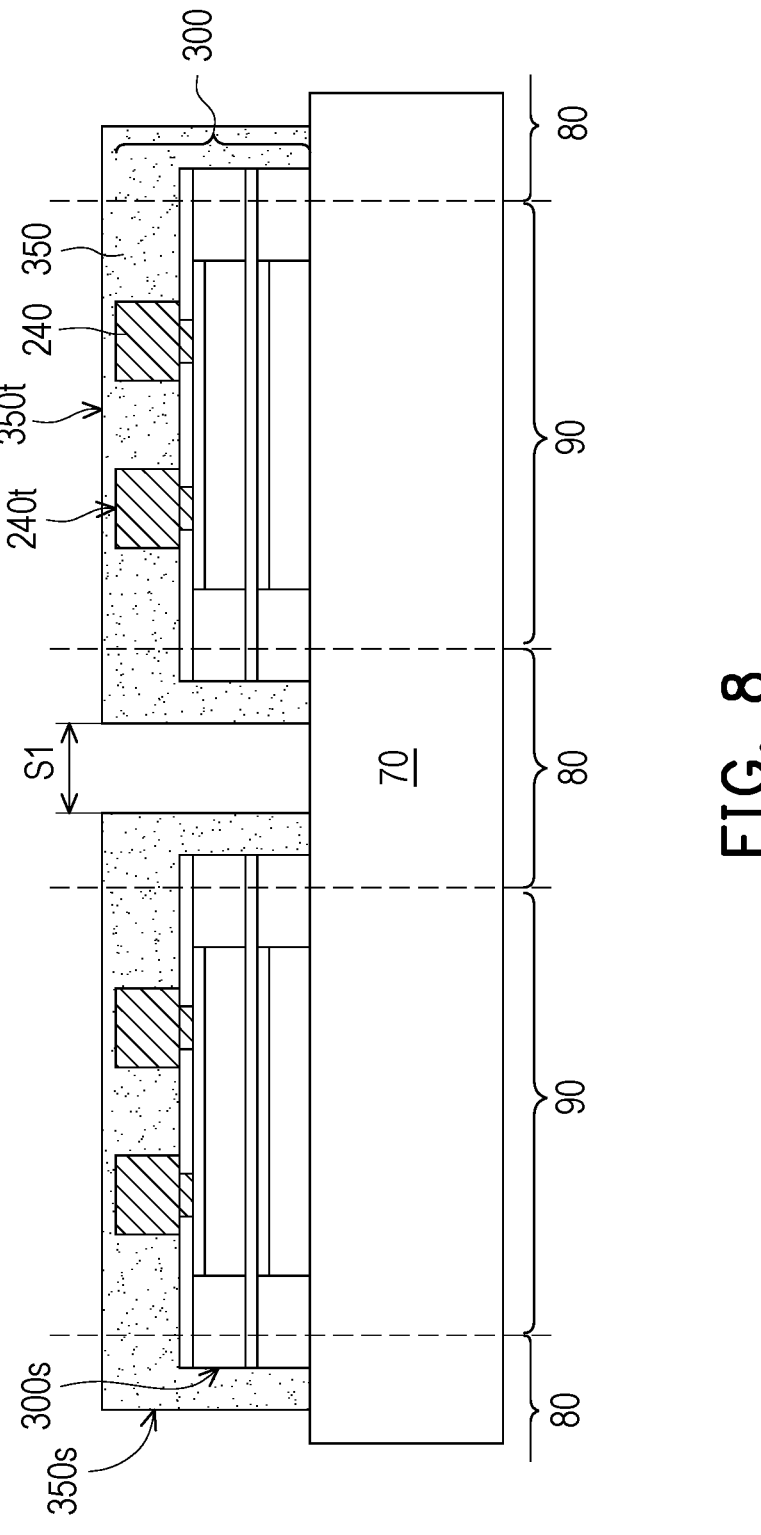

Referring to FIG. 8, protection structures 350 are formed over the die stack structures 300 and the support substrate 70. In some embodiments, the protection structures 350 are formed by first depositing a protection layer which covers the die stack structures 300 on the support substrate 70, and then patterning the protection layer to form the separate protection structures 350. For example, adjacent protection structures 350 are patterned to be spaced apart from each other by a spacing Si.

In some embodiments, the protection layer includes one or more layers of organic dielectric materials, such as high-density plasma (HDP) oxide, tetra-ethyl-ortho-silicate (TEOS), undoped silicate glass (USG), PBO, polyimide (PI), the like, or a combination thereof. The protection layer may be formed through CVD process or other suitable deposition process. In some embodiments, the patterning of the protection layer includes exposure and development processes, lase drilling process, photolithography and etching processes, or a combination thereof.

As shown in FIG. 8, subsequent to the patterning of the protection layer, each of the die stack structures 300 is covered by one protection structure 350. That is, sidewalls 300s of the die stack structures 300 are covered by the protection structure 350, and top surfaces 240t of the conductive pillars 240 are at a lower level than a top surface 350t of the protection structure 350. In some embodiments, sidewalls 350s of the protection structure 350 are formed as straight vertical sidewall standing on the top surface 70t of the support substrate 70 at the scribe line regions 80.

Figure 9:
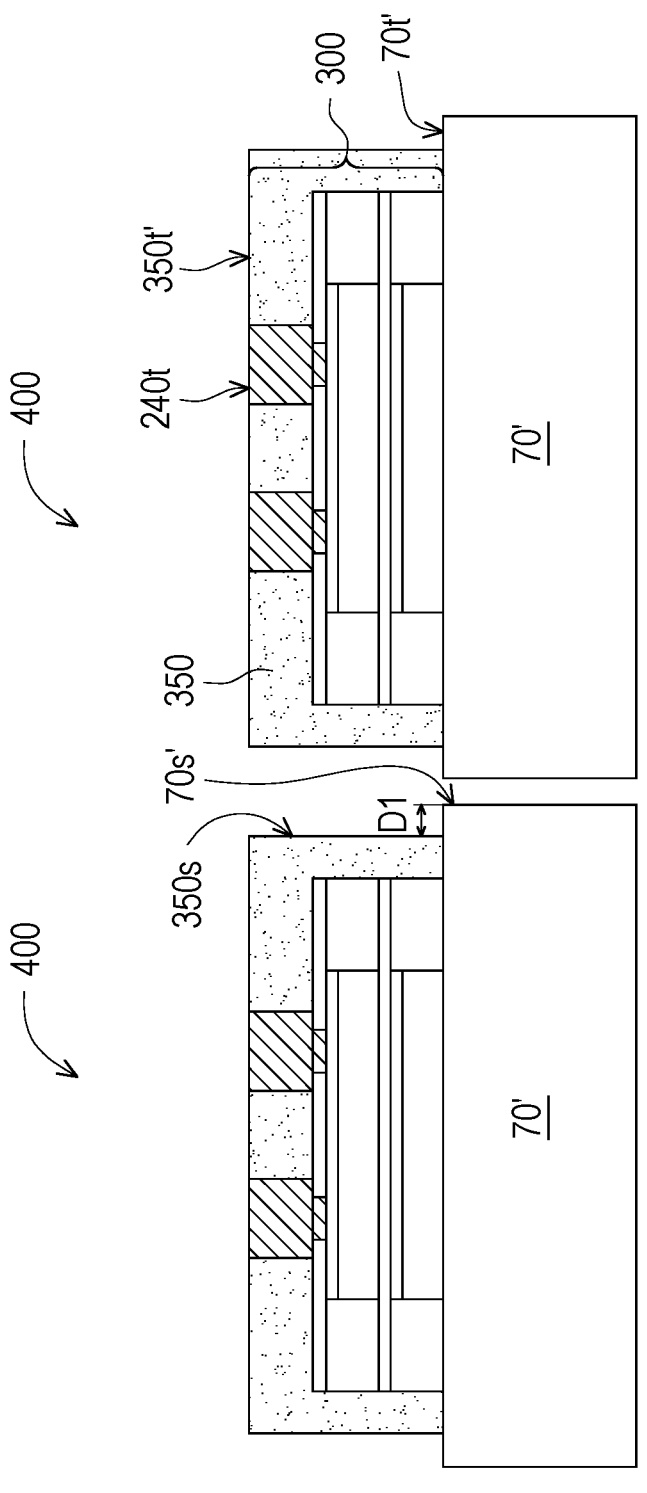

Referring to FIG. 9, a planarization process and a singulation process are sequentially performed, such that a package component 400 is formed. In some embodiments, the planarization process includes a CMP process or a mechanical grinding process. After the planarization process is performed, each of the die stack structures 300 is laterally surrounded by the protection structure 350, and a top surface 350t' of the protection structure 350 and top surfaces 240t of the conductive pillars 240 are substantially coplanar with each other. The singulation process is then performed by sawing along scribe line regions 80 (e.g., between the separate protection structures 350). The support substrate 70 is cut through after the singulation process, such that the package components 400 are formed each including a discrete support substrate 70'. As shown in FIG. 9, sidewalls 70s' of the support substrate 70' are respectively offset from the sidewalls 350s of the protection structure 350 by a distance D1, and a top surface 70t' of the support substrate 70' that is not covered by the die stack structure 300 and the protection structure 350 remains uncovered.

As described above, the die stack structure 300 is encapsulated (e.g., laterally surrounded) by the protection structure 350, so as the die stack structure 300 is protected from being damaged during subsequent processes. Furthermore, the inorganic portions (e.g., the insulation structures 110', 210') of the die stack structure 300 is wrapped by the protection structure 350 formed of an organic material, and the protection structure 350 separates the inorganic portions of the die stack structure 300 from the encapsulant (e.g., molding compound) later formed.

Typically, the insulation portions of the die stack structure are in direct contact with the later-formed encapsulant such that an organic-inorganic interface (i.e., hetero-interface) is formed between the insulation portions and the encapsulant, resulting in delamination (i.e., peeling) or cracking issues that are induced by poor adhesion between the insulation portions and the encapsulant. By performing a pre-cutting process to form die stack structures over the support substrate and forming protection structures that covers the die stack structures, the undesirable hetero-interface between the inorganic portions of the die stack structures and the later-formed encapsulant is replaced with an organic-organic interface (i.e., interface between the protection structures and the encapsulant), so that aforementioned delamination or cracking issues can be eliminated without major process change.

Figure 10:
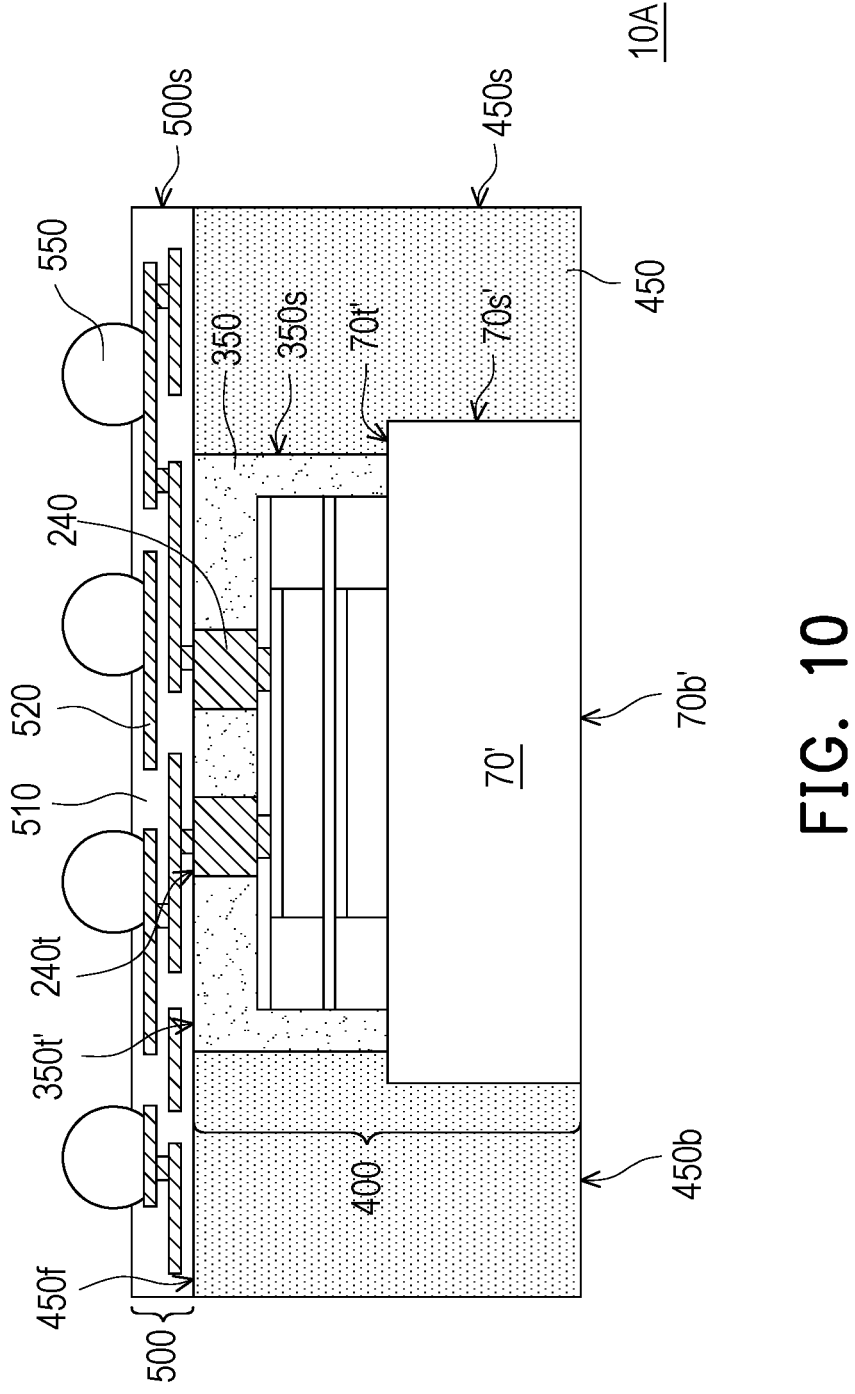

Referring to FIG. 10, a package structure 10A that includes one package component 400 is formed. The package structure 10A may be an InFo package. For example, the package structure 10A includes the package component 400, an encapsulant 450 around the package component 400, a redistribution circuit structure 500 over the package component 400 and the encapsulant 450, and a plurality of conductive terminals 550 over the redistribution circuit structure 500. As shown in FIG. 10, the encapsulant 450 is formed laterally around the package component 400, such that the sidewalls 70s' of the support substrate 70', the sidewalls 350s of the protection structure 350, and the exposed top surface 70t' of the support substrate 70' are in contact with and covered by the encapsulant 450. As such, the die stack structure 300 is separated from the encapsulant 450 by the protection structure 350. In other words, the sidewalls 300s of the die stack structure 300 are spaced apart from the encapsulant 450 by the protection structure 350.

In some embodiments, the encapsulant 450 includes a molding compound, a molding underfill, a resin (such as an epoxy resin), or the like. The encapsulant 450 may be formed through an over-molding process. Further, in some embodiments, a back surface 450b of the encapsulant 450 is substantially coplanar with a back surface 70b' of the support substrate 70', and a front surface 450f of the encapsulant 450 is substantially coplanar with top surfaces 240t of the conductive pillars 240 and the top surface 350t' of the protection structure 350.

The redistribution circuit structure 500 is then formed over the package component 400 and the encapsulant 450, and the conductive terminals 550 are formed on the redistribution circuit structure 500. In some embodiments, sidewalls 500s of the redistribution circuit structure 500 are substantially aligned with sidewalls 450s of the encapsulant 450. Further, the redistribution circuit structure 500 is electrically connected to the package component 400, and the conductive terminals 550 are electrically connected to the redistribution circuit structure 500, for example. In some embodiments, the formation of the redistribution circuit structure 500 includes sequentially forming one or more dielectric layers 510 and one or more patterned conductive layers 520 in alternation. For example, the patterned conductive layers 520 are sandwiched between the dielectric layers 510.

In addition, in some embodiments, the top surface of a topmost layer of the patterned conductive layers 520 is exposed by a topmost layer of the dielectric layers 510 for connecting with later-formed or later-disposed conductive connectors (e.g. the conductive terminals 550). In some embodiments, a lowest layer of the patterned conductive layers 520 is exposed by a lowest layer of the dielectric layers 510 for connecting underlying connectors (e.g. the conductive pillars 240 of the package component 400). The numbers of the layers of the dielectric layers 510 and the patterned conductive layers 520 may be less than or more than what is depicted in FIG. 10 and may be designated based on the demand and/or design layout.

Still referring to FIG. 10, in some embodiments, the conductive terminals 550 are provided and placed over the topmost layer of the patterned conductive layers 520. For example, the conductive terminals 550 are placed on the topmost layer of the patterned conductive layers 520 through a ball placement process. In alternative embodiments, a plurality of under-ball metallurgy (UBM) patterns (not shown) is formed between the topmost layer of the patterned conductive layers 520 and the conductive terminals 550. The conductive terminals 550 may be or include conductive balls (e.g., solder balls).

Figure 11:
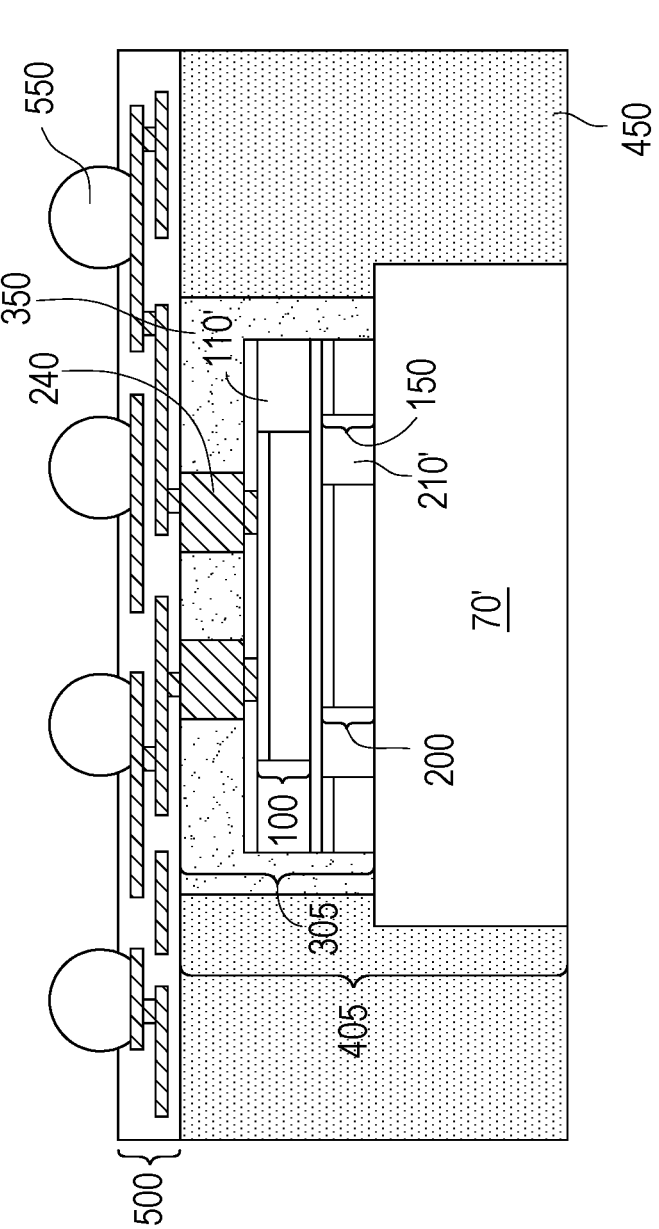
FIG. 11 is a schematic cross-sectional view showing a package structure in accordance with some embodiments of the disclosure.

FIG. 11 is a schematic cross-sectional view showing a package structure 10B in accordance with some embodiments of the disclosure. The package structure 10B is similar to the package structure 10A and thus only the difference is detailed. In accordance with some embodiments, the package structure 10B comprises a package component 405, which includes a die stack structure 305, an encapsulant 450 around the package component 405, a redistribution circuit structure 500 over the package component 405 and the encapsulant 450, and a plurality of conductive terminals 550 over the redistribution circuit structure 500.

In the illustrated embodiment, the die stack structure 305 includes a device die 100, a device die 200 having smaller size than the device die 100, and dummy dies 150 beside the device die 200. The dummy dies 150 may be arranged beside the device die 200 to mitigate warpage due to coefficient of thermal expansion (CTE) mismatch amongst different tiers (i.e., level of dies). Hence, the dummy dies 150 may not include any functional circuitry or active devices and may be electrically isolated from other features (e.g., device dies 100, 200). For example, the dummy dies 150 may be a block of substantially pure silicon or other suitable material (e.g., glass).

In addition, because the dummy dies 150 are disposed beside the device die 200 and may be adjacent to the scribe line regions, sidewalls of the dummy dies 150 may be revealed and substantially aligned with sidewalls of the insulation layer 110' after the pre-singulation process is performed. In some alternative embodiments, the dummy dies 150 are disposed at the scribe line regions such that the dummy dies 150 are singulated during the pre-singulation process, and sidewalls of the singulated dummy dies 150 are substantially aligned with sidewalls of the insulation layer 110'. As a result, sidewalls of the dummy dies 150 may be covered by the protection structure 350, so that hetero-interfaces (e.g., inorganic-organic interface) between the encapsulant 450 and the insulation layer 110' and between the encapsulant 450 and the dummy dies 150 are avoided.

Figure 12:
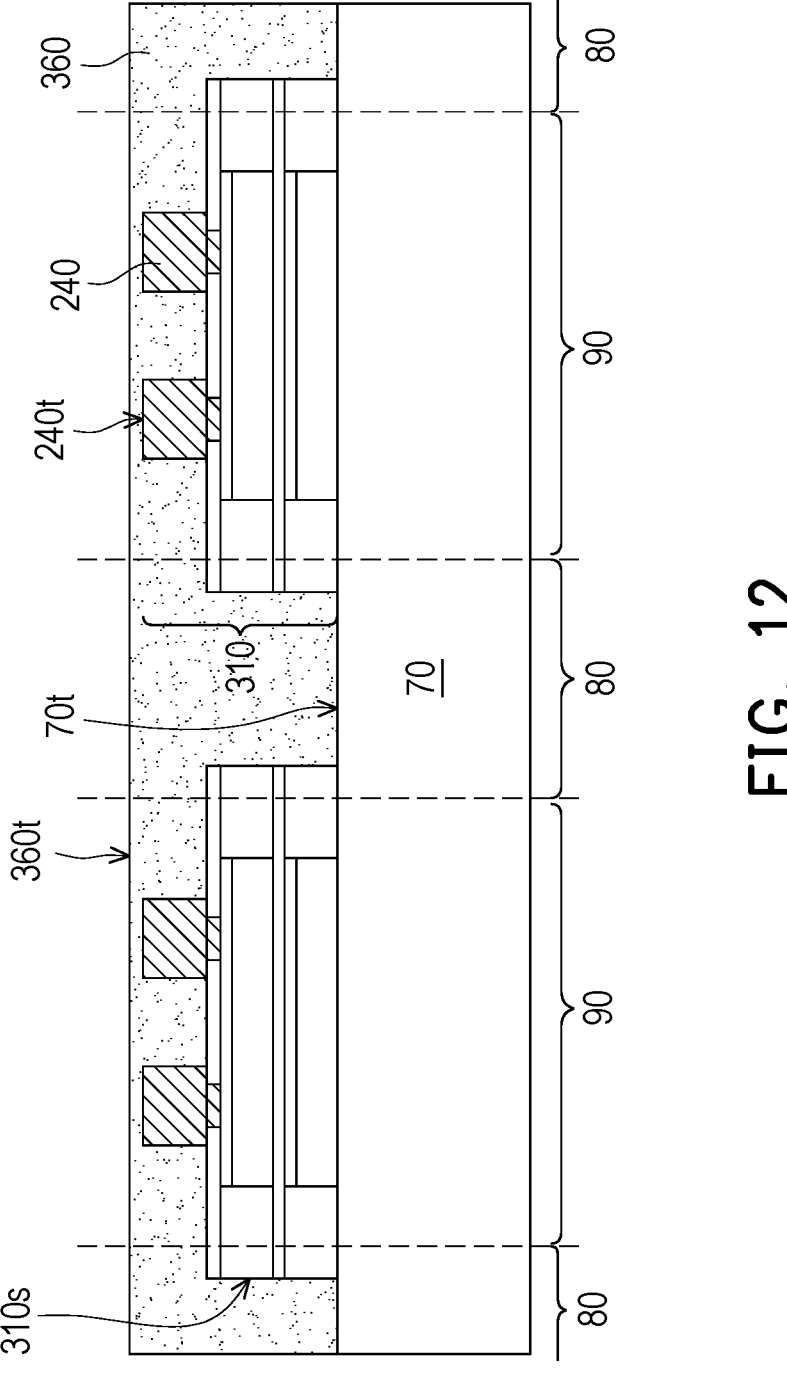
FIG. 12 through FIG. 14 are schematic cross-sectional views of various stages in a manufacturing method of a package structure in accordance with some embodiments of the disclosure.
Figure 13:
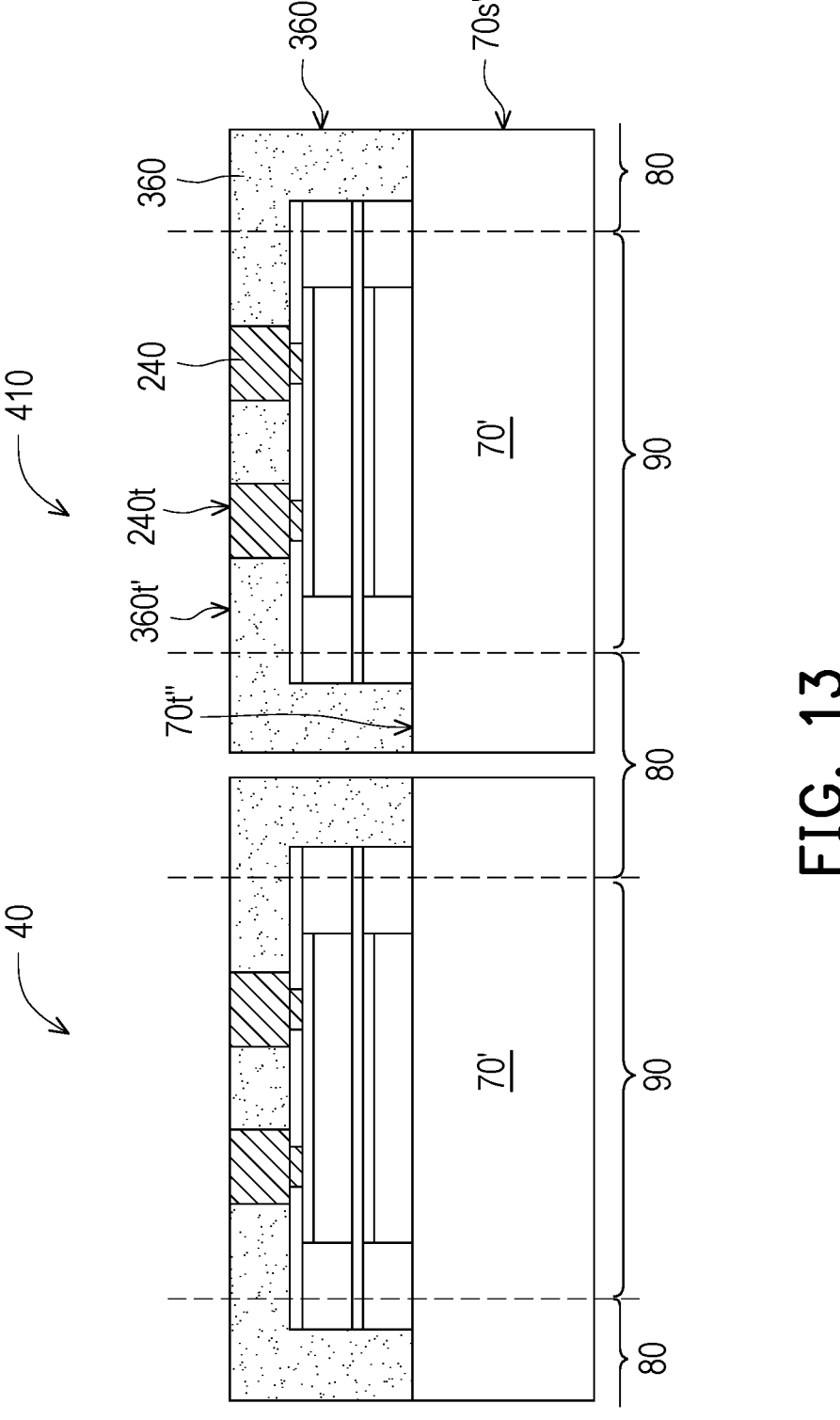
Figure 14:
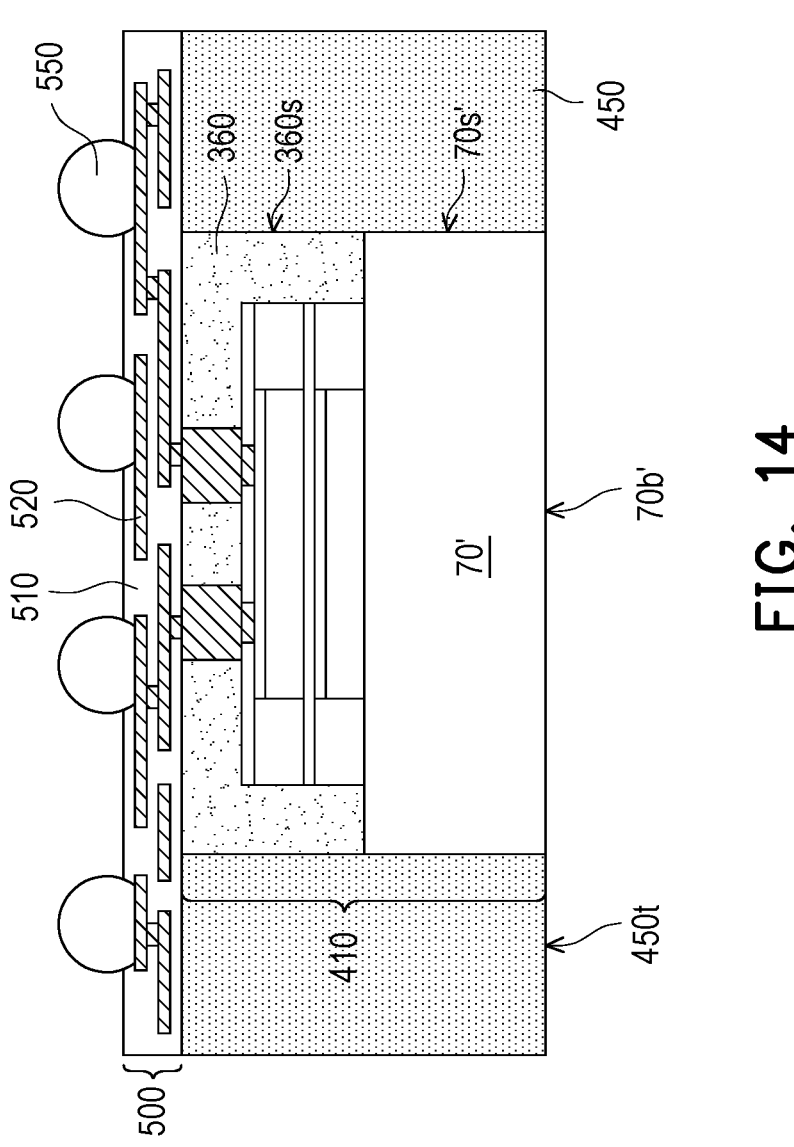

FIG. 12 through FIG. 14 are schematic cross-sectional views of various stages in a manufacturing method of a package structure 10C in accordance with some embodiments of the disclosure. The package structure 10C and its manufacturing method may share certain similarities with the package structure 10A and the manufacturing thereof with reference to FIG. 1 through FIG. 10. As such, only differences between the package structure 10B and the package structure 10A are further described, and process stages discussed in FIG. 1 through FIG. 7 are omitted for simplicity.

Referring to FIG. 12, after the pre-singulation process mentioned above, the die stack structures 310 are formed over the support substrate 70 at the package regions 90, and a portion of the top surface 70t is exposed at the scribe line region 80. A protection layer 360 is then globally deposited over the support substrate 70 and the die stack structures 310 through an acceptable deposition process such as CVD process. For example, the protection layer 360 is formed as a single continuous layer on the exposed top surface 70t of the support substrate 70 and covers the illustrated exposed surfaces of the die stack structures 310. That is, a top surface 360t of the protection layer 360 locates at a higher level than top surfaces 240t of the conductive pillars 240, and sidewalls 310s of the die stack structures 310 are covered by the protection layer 360. The protection layer 360 may include similar material as previously described with reference to the protection structures 350.

Referring to FIG. 13, a planarization process and a singulation process are sequentially performed, such that a package component 410 is formed. In some embodiments, after the planarization process, the die stack structures 310 are laterally surrounded by the protection layer 360, and a top surface 360t' of the protection layer 360 and top surfaces 240t of the conductive pillars 240 are substantially coplanar with each other. The singulation process is performed by sawing along the scribe line regions 80 and cutting through the protection layer 360 and the support substrate 70 to form the package components 410 that each includes a discrete support substrate 70'. As shown in FIG. 13, after the singulation process, sidewalls 70s' of the support substrate 70' are vertically aligned with the sidewalls 360s of the protection layer 360, and a top surface 70t'' of the support substrate 70' is covered by the protection layer 360.

Referring to FIG. 14, a package structure 10C that includes the package component 410 is formed. The package structure 10C may be an InFo package and include the package component 410, the encapsulant 450 around the package component 410, the redistribution circuit structure 500 over the package component 410 and the encapsulant 450, and the conductive terminals 550 over the redistribution circuit structure 500. As shown in FIG. 14, the encapsulant 450 laterally surrounds the package component 410, such that continuous straight sidewalls of the package component 410 (i.e., the sidewalls 70s' of the support substrate 70' and the sidewalls 360s of the protection layer 360) are in contact with and covered by the encapsulant 450.

Figure 15:
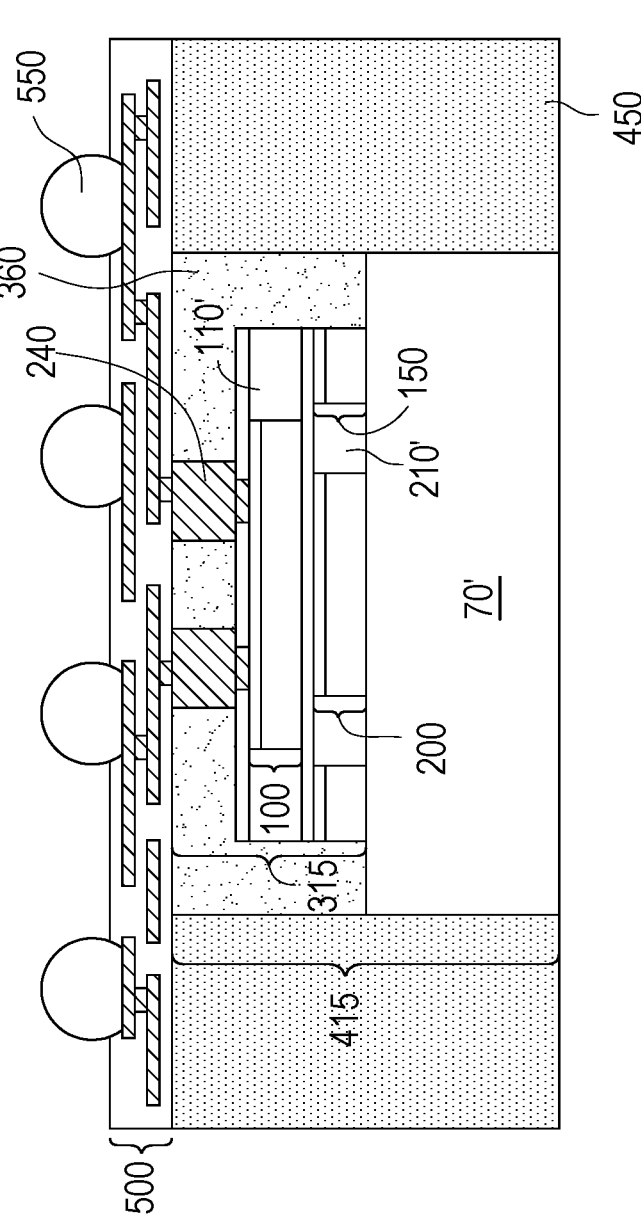
FIG. 15 is a schematic cross-sectional view showing a package structure in accordance with some embodiments of the disclosure.

FIG. 15 is a schematic cross-sectional view showing a package structure 10D in accordance with some embodiments of the disclosure. The package structure 10D is similar to the package structure 10C and thus only the difference is detailed. In accordance with some embodiments, the package structure 10D comprises a package component 415, which includes a die stack structure 315, an encapsulant 450 around the package component 415, a redistribution circuit structure 500 over the package component 415 and the encapsulant 450, and a plurality of conductive terminals 550 over the redistribution circuit structure 500.

The die stack structure 315 is similar to the die stack structure 305 discussed above with reference to FIG. 11 and the description is not repeated herein. As shown in FIG. 15, the sidewalls of the dummy dies 150 may be covered by the protection structure 360, so that the hetero-interfaces between the encapsulant 450 and the insulation layer 110' and between the encapsulant 450 and the dummy dies 150 are avoided.

FIG. 16 through FIG. 20 are schematic cross-sectional views of various stages in a manufacturing method of a package structure 20A in accordance with some embodiments of the disclosure. It is understood that additional operations can be provided before, during, and after processes shown by FIG. 16 through FIG. 20, and some of the operations described below can be replaced or eliminated, for additional embodiments of the method. The order of the operations/processes may be interchangeable.

Figure 16:
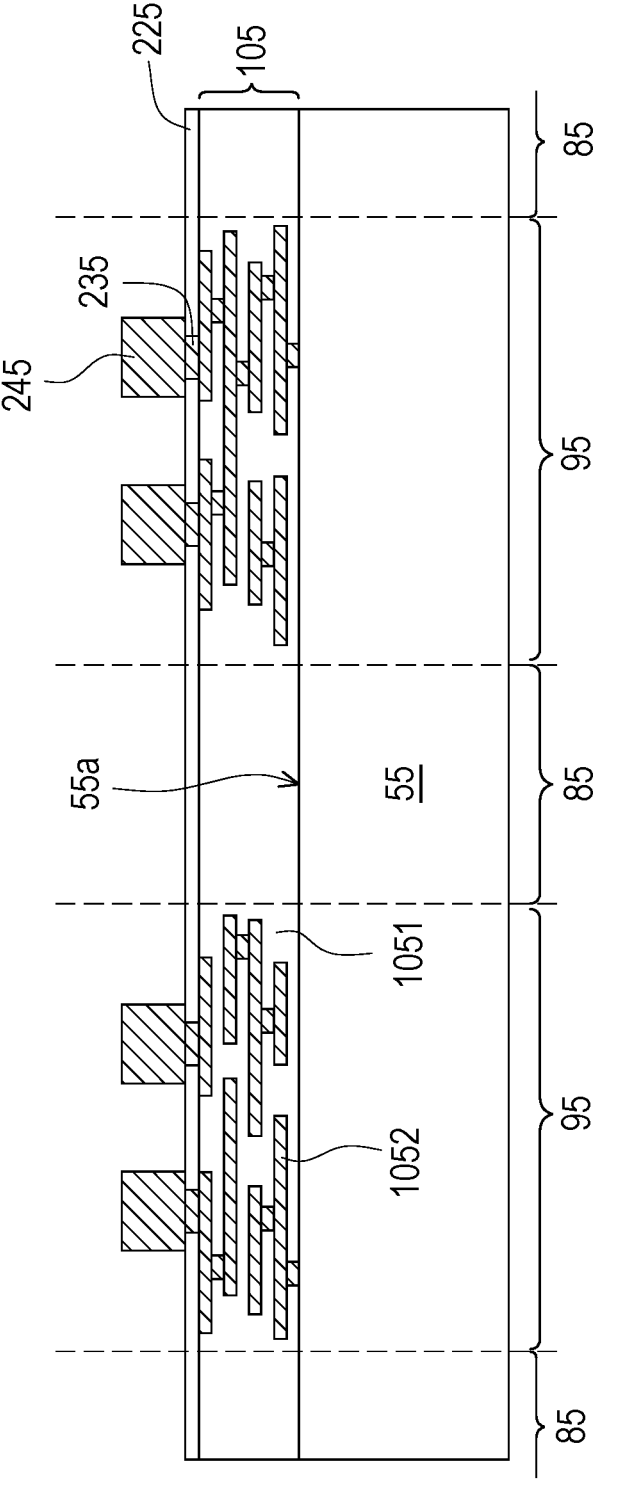
FIG. 16 through FIG. 20 are schematic cross-sectional views of various stages in a manufacturing method of a package structure in accordance with some embodiments of the disclosure.

Referring to FIG. 16, a semiconductor substrate 55 is provided. The semiconductor substrate 55 may be a bulk silicon substrate or a silicon-on-insulator substrate. In some embodiments, the semiconductor substrate 55 includes integrated circuits (not shown) formed at an active surface 55a (i.e., a front surface) of the semiconductor substrate 55, and the integrated circuits may include complementary metal oxide semiconductor (CMOS) transistors therein. In some more embodiments, the semiconductor substrate 55 includes scribe line regions 85 and device regions 95 arranged between neighboring scribe line regions 85.

Further, in some embodiments, an interconnect structure 105 is formed over the semiconductor substrate 55, and the interconnect structure 105 is electrically connected to the integrated circuits in the semiconductor substrate 55. The formation of the interconnect structure 105 may include sequentially forming one or more dielectric layers 1051 and one or more patterned conductive layers 1052 in alternation. For example, the patterned conductive layers 1052 are sandwiched between the dielectric layers 1051. In some embodiments, the dielectric layers 1051 are formed of low-k dielectric materials. The dielectric constants (k values) of the low-k dielectric materials may be less than about 2.8, or less than about 2.5 (i.e., extra low-k dielectric materials), for example. In some embodiments, the patterned conductive layers 1052 are formed of copper, a copper alloy, or other metal-containing conductive materials, and may be formed using single damascene and/or dual damascene processes. The numbers of the layers of the dielectric layers 1051 and the patterned conductive layers 1052 may be less than or more than what is depicted in FIG. 16 and may be designated based on the demand and/or design layout.

In addition, in some embodiments, a passivation layer 225 and a plurality of conductive pads 235 are formed over the interconnect structure 105, and a plurality of conductive pillars 245 are formed over the conductive pads 235 and over a portion of the passivation layer 225. In some embodiments, the conductive pads 235 are formed on a top surface of the interconnect structure 105 and are electrically connected to the topmost patterned conductive layers 1052 of the interconnect structure 105. The conductive pads 235 may include a conductive material such as aluminum, copper, or the like. The passivation layer 225 is then formed over the interconnect structure 105. Although not explicitly illustrated in FIG. 16, it is understood that one or more passivation layers 225 may be formed over the interconnect structure 105, and the passivation layer 225 may partially cover the conductive pads 235. In some embodiments, a material of the passivation layer 225 includes silicon oxide, silicon oxynitride, silicon nitride, BCB, PBO, polyimide, or a combination thereof.

The conductive pillars 245 are formed in physical and electrical contact with the conductive pads 235. In some embodiments, the conductive pillars 245 are formed by first forming and patterning a photoresist (not shown) to form openings in the photoresist that corresponds to the conductive pillars 245 to be formed, followed by a plating process, such as electroplating or electroless plating. In some embodiments, the conductive pillars 245 include conductive metal such as copper, titanium, gold, aluminum, tungsten, cobalt, palladium, nickel, silver, compounds or alloys of the same, or other conductive materials. The photoresist may then be removed by ashing or stripping process.

As illustrated in FIG. 16, in some embodiments, orthogonal projections of the patterned conductive layers 1052 of the interconnect structure 105, the conductive pads 235, and the conductive pillars 245 are overlapped with orthogonal projections of the device regions 95. In other words, the electrical paths between the semiconductor substrate 55 and the overlying conductive structure do not extend into the scribe line regions 85.

Figure 17:
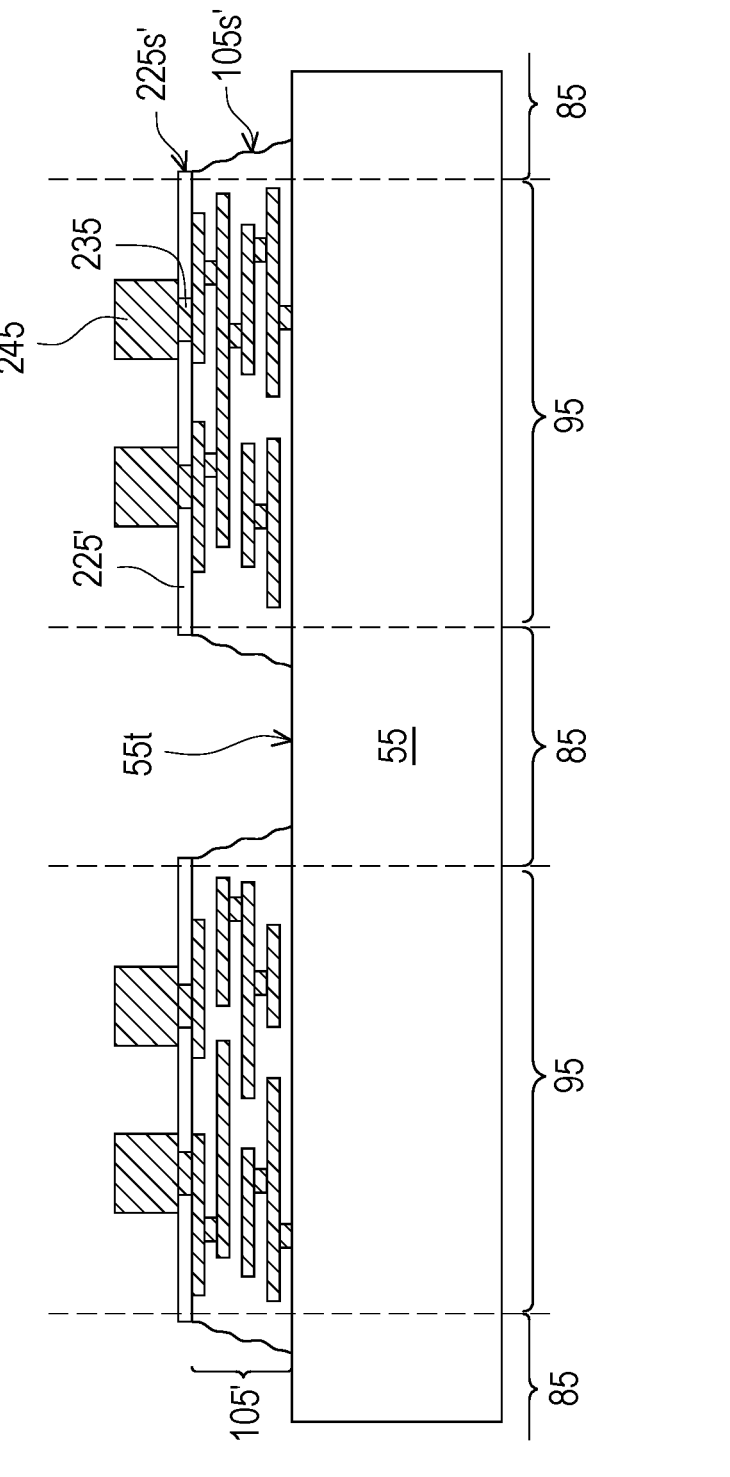

Referring to FIG. 17, one or more pre-singulation (or pre-cutting) processes are performed so that discrete interconnect structure 105' are formed. For example, the pre-singulation process(es) is performed to cut through the passivation layer 225 and the dielectric layers 1051 of the interconnect structure 105. In some embodiments, the pre-singulation process(es) stops at a top surface 55*t* of the semiconductor substrate 55, such that the semiconductor substrate 55 remains intact during the pre-singulation process. The pre-singulation process may be a wafer dicing process including mechanical blade sawing and/or laser cutting. In a certain embodiment, a mechanical blade sawing is first performed to cut the passivation layer 225, and a laser cutting is then performed to cut the dielectric layers 1051. In such embodiments, sidewalls 225*s'* of the passivation structure 225' are substantially straight and vertical while sidewalls 105*s'* of the discrete interconnect structure 105' are rough and slanted, as illustrated in FIG. 17. In addition, sidewalls 105*s'*, 225*s'* may be located at the scribe line regions 85 due to process variations.

Figure 18:
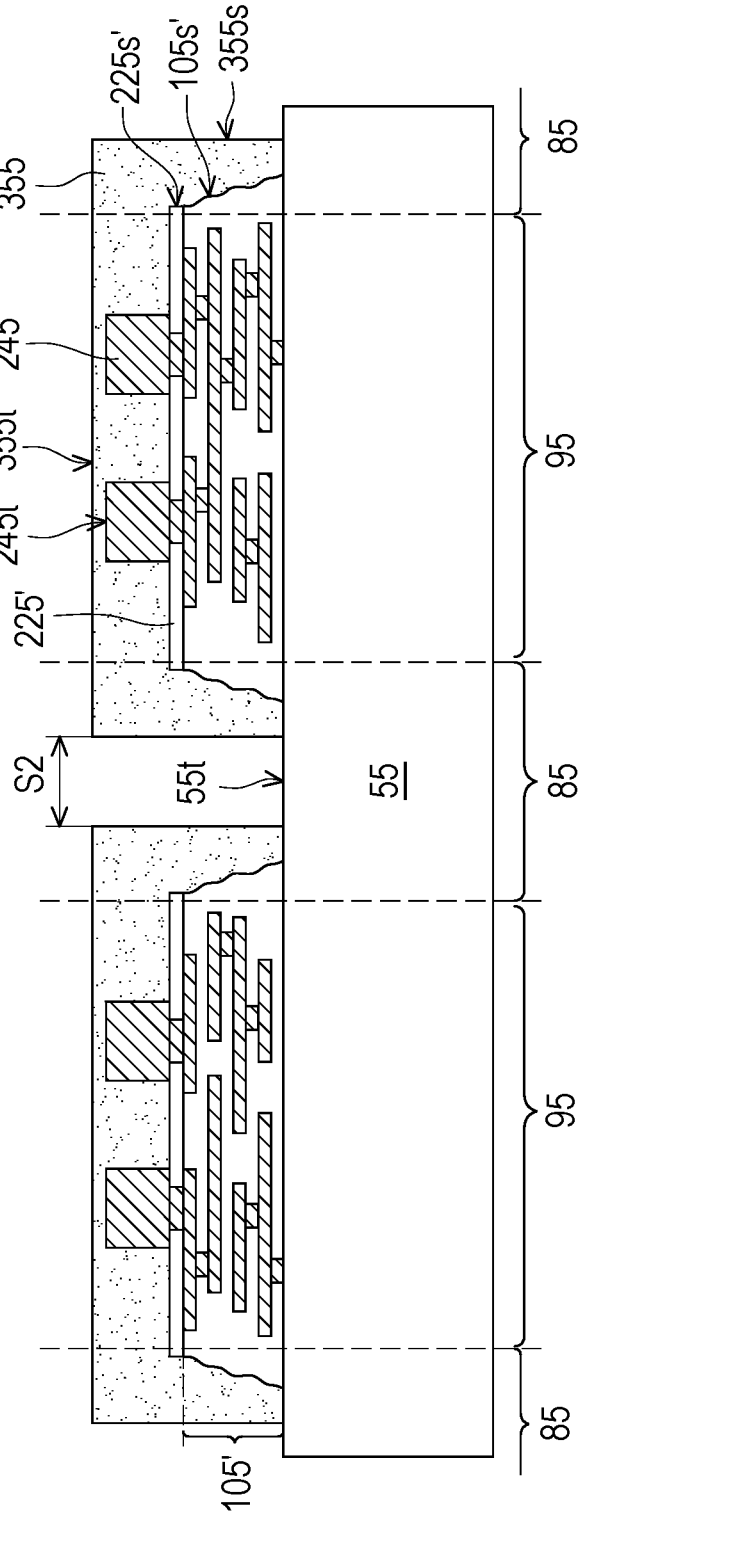

Referring to FIG. 18, protection structures 355 are formed over the semiconductor substrate 55 and covering the discrete interconnect structures 105', the passivation structures 225' and the conductive pillars 245. In some embodiments, the protection structures 355 are formed by first depositing a protection layer that covers the discrete interconnect structures 105', the passivation structures 225' and the conductive pillars 245, and then patterning the protection layer to form the separate protection structures 355. For example, adjacent protection structures 355 are spaced apart from each other by a spacing S2. The protection structures 355 may be formed of similar material using similar techniques as described above for the protection structures 350 and the description is not repeated herein.

As shown in FIG. 18, the sidewalls 105*s'* of the discrete interconnect structures 105' and the sidewalls 225*s'* of the passivation structures 225 are covered by the protection structures 355, and top surfaces 245*t* of the conductive pillars 245 are located at a lower level than top surfaces 355*t* of the protection structures 355. In some embodiments, sidewalls 355*s* of the protection structures 355 are formed as straight vertical sidewalls standing on the top surface 55*t* of the semiconductor substrate 55 at the scribe line regions 85.

Figure 19:
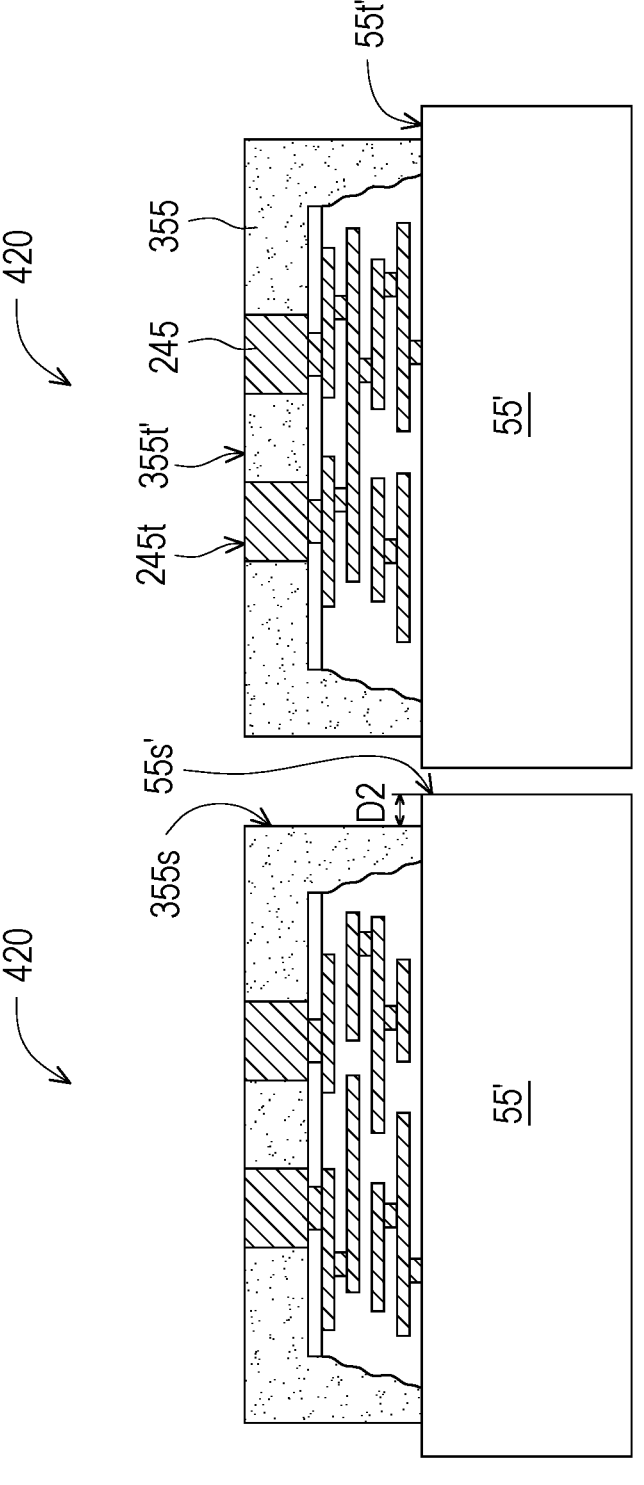

Referring to FIG. 19, a planarization process and a singulation process are sequentially performed, such that a package component 420 is formed. The planarization process may be a CMP process or a mechanical grinding process. After the planarization process is performed, top surfaces 355*t'* of the protection structures 355 and top surfaces 240*t* of the conductive pillars 240 are substantially coplanar with each other. The singulation process is performed by sawing along scribe line regions 85 (e.g., between adjacent protection structures 355). The semiconductor substrate 55 is cut through after the singulation process such that the package components 420 that each includes a discrete semiconductor substrate 55' are formed. As shown in FIG. 19, sidewalls 55*s'* of the semiconductor substrate 55' are offset from respective sidewalls 355*s* of the protection structure 355 by a distance D2, and a top surface 55*t'* of the semiconductor substrate 55' that is not covered by the interconnect structure and the protection structure 355 remains uncovered.

Figure 20:
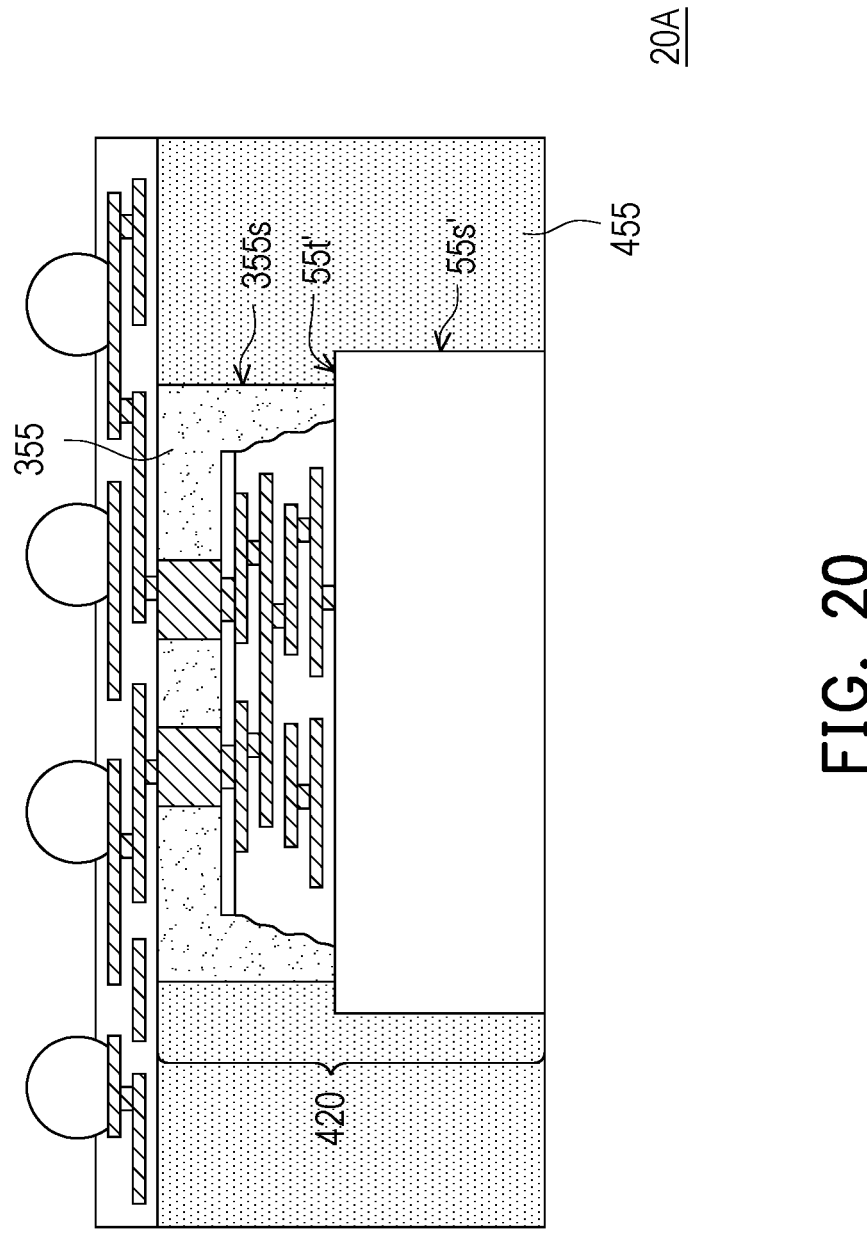

Referring to FIG. 20, a package structure 20A including the package component 420 is formed. The package structure 20A may be an InFo package and may include similar structure as the package structure 10A and thus only the difference is detailed. As illustrated in FIG. 20, the encapsulant 450 is formed laterally around the package component 420, such that the sidewalls 55*s'* of the semiconductor substrate 55', the sidewalls 355*s* of the protection structure 355, and the exposed top surface 55*t'* of the semiconductor substrate 55' are in contact with and covered by the encapsulant 450.

Figure 21:
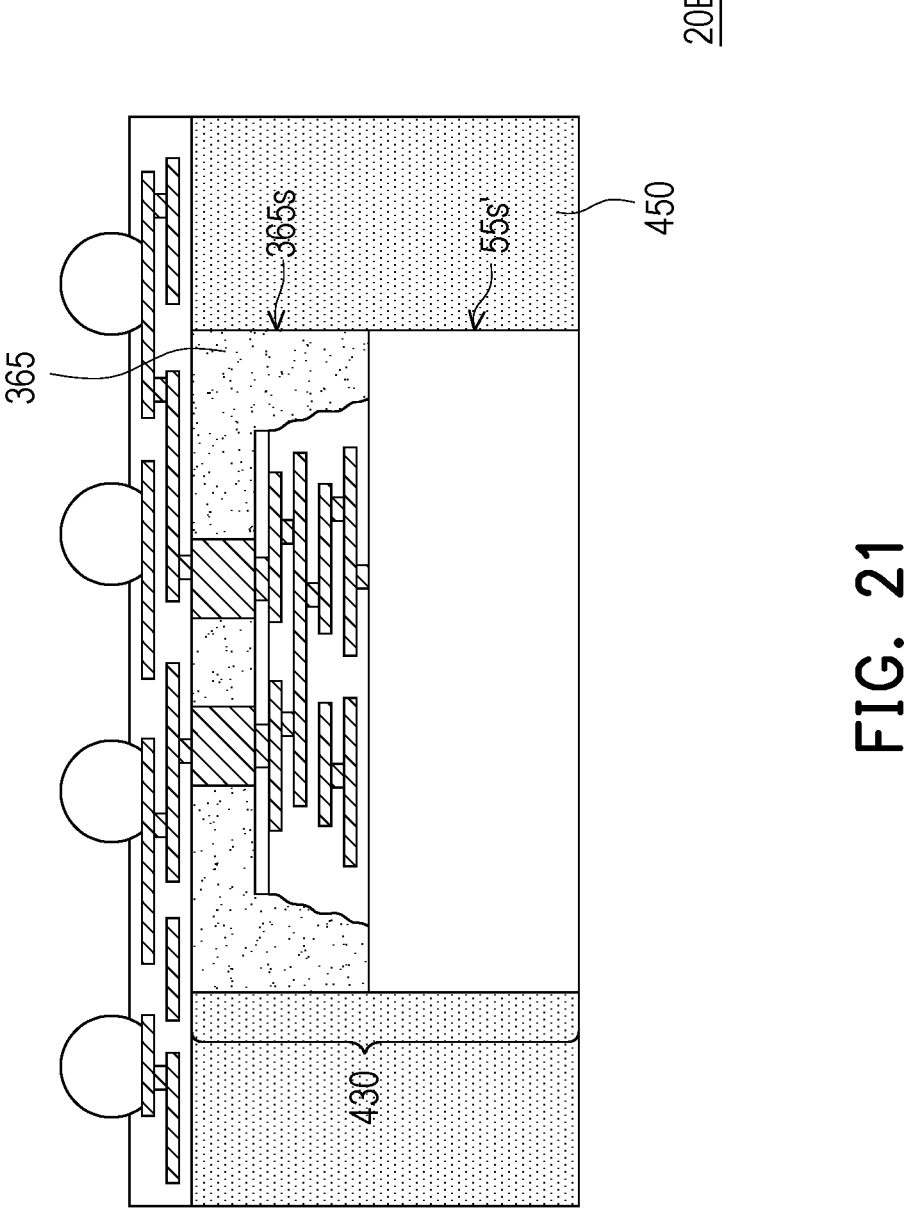
FIG. 21 is a schematic cross-sectional view showing a package structure in accordance with some embodiments of the disclosure.

FIG. 21 is a schematic cross-sectional view showing a package structure 20B in accordance with some embodiments of the disclosure. The package structure 20B may be similar to the package structure 20A. The only difference between the package structure 20B and the package structure 20A lies in that, in a package component 430 of the package structure 20B, a protection layer 365 is formed over the semiconductor substrate 55' to completely cover the semiconductor substrate 55', so that sidewalls 365*s* of the protection layer 365 are vertically aligned with sidewalls 55*s'* of the semiconductor substrate 55'. Further, continuous straight sidewalls of the package component 430 (i.e., the sidewalls 55*s'* of the semiconductor substrate 55' and the sidewalls 365*s* of the protection layer 365) are in contact with and covered by the encapsulant 450.

Similar to the package structures 10A-10D as described above, the package structures 20A, 20B each includes a package component where a protection structure (or protection layer) wraps around an interconnect structure, thereby avoiding the formation of an inorganic-organic interface between the interconnect structure (e.g., dielectric layers that include low-k dielectric material) and the encapsulant. Therefore, the delamination or cracking issues that may occur at the heterogeneous interface can be reduced.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with an embodiment of the disclosure, a package structure is described. The package structure includes a package component, an encapsulant disposed around the package component, and a redistribution structure disposed over the package component and the encapsulant. The package component includes a substrate, a protection structure, which includes an organic material, over a first surface of the substrate, and a multi-layered structure encapsulated by the protection structure. Sidewalls of the multi-layered structure are spaced apart from the encapsulant by the protection structure.

In accordance with an embodiment of the disclosure, a method of manufacturing a package structure is described. The method includes at least the following steps. A stacked structure is formed over a substrate. A first singulation process is performed by cutting through the stacked structure at scribe line regions to form die stacks. A protection structure is formed over the substrate, and sidewalls of the die stacks are covered by the protection structure. A second singulation process is performed to form package components that each includes one of the die stacks. Each of the package components is encapsulated by a molding compound. A redistribution structure electrically connected to the package component is formed.

In accordance with yet another embodiment of the disclosure, a method of manufacturing a package structure is described. An interconnect structure is formed over a semiconductor substrate, and the interconnect structure includes a plurality of dielectric layers and a plurality of conductive layers stacked in alternation. A first cutting process is performed at scribe line regions to form singulated interconnect structures. An organic layer is formed over the semiconductor substrate and the singulated interconnect structures. A second cutting process is performed to form package components that each includes one of the singulated interconnect structures. Each of the package components is encapsulated by an encapsulant. A redistribution structure is formed over the package component and the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a package structure, comprising:
   forming a stacked structure over a top surface of a substrate;
   performing a first singulation process by cutting through the stacked structure at scribe line regions to reveal portions of the top surface of the substrate and form die stacks;
   forming a protection structure over the substrate, wherein the portions of the top surface of the substrate and sidewalls of the die stacks are covered by the protection structure;
   performing a second singulation process to cut through the substrate to form package components that each includes one of the die stacks;
   encapsulating each of the package components with a molding compound; and
   forming a redistribution structure that is electrically connected to the package components.

2. The method of claim 1, wherein forming the protection structure over the substrate comprises: forming a continuous layer that covers the portions of the top surface of the substrate and the die stacks; and performing a planarization process to remove excessive portions from the continuous layer.

3. The method of claim 2, wherein forming the protection structure over the substrate further comprises patterning the continuous layer to form a plurality of patterned structures after forming the continuous layer and before performing the planarization process.

4. The method of claim 3, wherein the patterned structures each encapsulates one die stack.

5. A method for manufacturing a package structure, comprising:
   providing a first die over a first substrate;
   laterally encapsulating the first die with a first insulation layer over the first substrate;
   providing a second die over the first die and the first insulation layer;
   laterally encapsulating the second die with a second insulation layer;
   forming conductor pillars electrically connected to the first die laterally encapsulated by the first insulation layer;
   performing a first singulation process by cutting the first insulation layer and the second insulation layer to form die stacks;
   forming a protection structure, wherein sidewalls of the die stacks are covered by the protection structure;
   patterning the first substrate to form package components;
   encapsulating the package components with encapsulations; and
   forming a redistribution structure over the package components and the encapsulations.

6. The method of claim 5 further comprising:
   before forming the conductor pillars, bonding the first die laterally encapsulated by the first insulation layer and the second die laterally encapsulated by the second insulation layer with a second substrate.

7. The method of claim 6, wherein the second die and the second insulation layer are in contact with the second substrate after bonding the first die laterally encapsulated by the first insulation layer and the second die laterally encapsulated by the second insulation layer with the second substrate.

8. The method of claim 6, wherein the conductor pillars are formed over the first die laterally encapsulated by the first insulation layer after bonding the first die laterally encapsulated by the first insulation layer and the second die laterally encapsulated by the second insulation layer with the second substrate.

9. The method of claim 6 further comprising:
   performing a second singulation process after patterning the protection structure, wherein the second singulation process is performed to cut the second substrate to form the package components.

10. The method of claim 9, wherein sidewalls of the second substrate laterally offset from sidewalls of the protection structure by a distance after performing a second singulation process.

11. The method of claim 6 further comprising:
   sequentially performing a planarization process and a singulation process to pattern patterning the protection structure and the second substrate.

12. The method of claim 11, wherein after sequentially performing the planarization process and the singulation process, the conductive pillars are revealed.

13. The method of claim 11, wherein after sequentially performing the planarization process and the singulation process, sidewalls of the second substrate are laterally offset from sidewalls of the protection structure.

14. The method of claim 5, wherein the protection structure is patterned by exposure and development processes, laser drilling process, photolithography and etching processes, or a combination thereof.

15. The method of claim 5 further comprising:

providing a dummy die aside the second die, wherein the dummy die and the second die are laterally encapsulated by the second insulation layer.

16. The method of claim 15, wherein sidewalls of the dummy die are covered by and in contact with the protection structure.

17. A method for manufacturing a package structure, comprising:

providing stacked dies over a substrate;

laterally encapsulating the stacked dies with an insulation layer over the substrate;

forming conductor pillars electrically connected to the stacked dies laterally encapsulated by the insulation layer;

performing a first singulation process by cutting the insulation layer to expose regions of the substrate to form die stacks;

forming a protection structure, wherein sidewalls of the die stacks and the regions of the substrate are covered by and in contact with the protection structure;

patterning the substrate to form package components;

encapsulating the package components with encapsulations; and forming a redistribution structure over the package components and the encapsulations.

18. The method of claim 17, wherein forming the protection structure comprises:

forming a continuous layer that covers the regions of the substrate and the die stacks; and performing a planarization process to remove excessive portions from the continuous layer.

19. The method of claim 18, wherein forming the protection structure over the substrate further comprises:

patterning the continuous layer to form a plurality of patterned structures after forming the continuous layer and before performing the planarization process.

20. The method of claim 19, wherein the patterned structures each encapsulates one of the die stacks.

* * * * *